(12) United States Patent
Roberts, Jr.

(10) Patent No.: US 10,043,722 B2
(45) Date of Patent: Aug. 7, 2018

(54) METHOD FOR TESTING SEMICONDUCTOR WAFERS USING TEMPORARY SACRIFICIAL BOND PADS

(71) Applicant: CELERINT, LLC, New York, NY (US)

(72) Inventor: Howard Roberts, Jr., Austin, TX (US)

(73) Assignee: CELERINT, LLC, New York, NY (US)

( * ) Notice: Subject to any disclaimer, the term of this patent is extended or adjusted under 35 U.S.C. 154(b) by 0 days.

(21) Appl. No.: 15/108,694

(22) PCT Filed: Dec. 24, 2014

(86) PCT No.: PCT/US2014/072359
§ 371 (c)(1),
(2) Date: Jun. 28, 2016

(87) PCT Pub. No.: WO2015/103076
PCT Pub. Date: Jul. 9, 2015

(65) Prior Publication Data
US 2016/0336243 A1    Nov. 17, 2016

Related U.S. Application Data

(60) Provisional application No. 61/921,734, filed on Dec. 30, 2013.

(51) Int. Cl.
*H01L 21/66* (2006.01)
*H01L 23/00* (2006.01)
(Continued)

(52) U.S. Cl.
CPC ............ *H01L 22/32* (2013.01); *H01L 21/78* (2013.01); *H01L 22/14* (2013.01); *H01L 23/544* (2013.01);
(Continued)

(58) Field of Classification Search
CPC ......... H01L 22/32; H01L 21/78; H01L 22/14; H01L 23/544; H01L 24/06;
(Continued)

(56) References Cited

U.S. PATENT DOCUMENTS 5,923,047 A * 7/1999 Chia .................. H01L 22/32
257/48
5,956,567 A    9/1999 Tomita
(Continued)

OTHER PUBLICATIONS

International Search Report, dated Mar. 20, 2015, in International Application No. PCT/US2014/072359.
(Continued)

*Primary Examiner* — Kyoung Lee
(74) *Attorney, Agent, or Firm* — Greenblum & Bernstein, P.L.C.

(57) ABSTRACT

A method is provided for testing a semiconductor wafer, including individual semiconductor devices located on the semiconductor wafer, using temporary counterpart sacrificial bond pads. The method includes arranging individual semiconductor devices on the semiconductor wafer in a configuration having horizontal rows of the individual semiconductor devices separated by functional horizontal scribe lanes, and having vertical columns of individual semiconductor devices separated by functional vertical scribe lanes. The method includes creating the temporary counterpart sacrificial bond pads, located in the functional horizontal scribe lanes and/or vertical scribe lanes, that are electrically connected to corresponding normal individual bond pads located on individual semiconductor devices. The method also includes electrically testing the individual semiconductor devices using the temporary counterpart sacrificial bond pads, and destroying the temporary counterpart sacrificial bond pads upon completion of the electrical testing when the
(Continued)

Bond Pads on Device individual semiconductor devices are cut from the semiconductor wafer.

17 Claims, 11 Drawing Sheets

(51) Int. Cl.
*H01L 21/78* (2006.01)
*H01L 23/544* (2006.01)
*H01L 23/31* (2006.01)

(52) U.S. Cl.
CPC .......... *H01L 24/06* (2013.01); *H01L 23/3121* (2013.01); *H01L 2223/5446* (2013.01); *H01L 2224/04042* (2013.01); *H01L 2224/06135* (2013.01); *H01L 2224/32245* (2013.01); *H01L 2224/48091* (2013.01); *H01L 2224/48247* (2013.01); *H01L 2224/73265* (2013.01); *H01L 2224/94* (2013.01)

(58) Field of Classification Search
CPC . H01L 2224/48091; H01L 2224/32245; H01L 2224/94; H01L 2224/04042; H01L 23/3121; H01L 2224/06135; H01L 2224/73265; H01L 2224/48247

See application file for complete search history.

(56) References Cited

U.S. PATENT DOCUMENTS

| | | | |
|---|---|---|---|
| 6,573,113 B1 | 6/2003 | Low | |
| 7,064,450 B1 | 6/2006 | Eghan et al. | |
| 8,237,160 B2 | 8/2012 | Chen et al. | |
| 2006/0109014 A1* | 5/2006 | Chao | G01R 31/2891 324/756.03 |
| 2007/0275539 A1 | 11/2007 | Rashid et al. | |
| 2008/0017856 A1 | 1/2008 | Fujino | |
| 2009/0189299 A1* | 7/2009 | Miranda | H01L 22/14 257/782 |
| 2011/0284843 A1* | 11/2011 | Chen | H01L 22/34 257/48 |
| 2013/0299947 A1* | 11/2013 | Uehling | H01L 22/20 257/620 |

OTHER PUBLICATIONS

International Preliminary Report on Patentability, dated Jul. 14, 2016, in International Application No. PCT/US2014/072359.
First Office Action, dated May 30, 2018, from the State Intellectual Property Office of the People's Republic of China (SIPO) in Chinese Patent Application No. 2014/80071769.0.

* cited by examiner

Semiconductor Wafer

Individual Device on Wafer

Bond Pads on Device

Bond Wires To Package Lead Frame

Bond Wires To Package Pins

Horizontal Scribe Lane

Vertical Scribe Lane

Vertical Scribe Lane probe card
test sites

Horizontal Scribe Lane

Vertical Scribe Lane

METHOD FOR TESTING SEMICONDUCTOR WAFERS USING TEMPORARY SACRIFICIAL BOND PADS

CROSS-REFERENCE TO RELATED APPLICATION

This application claims the benefit of U.S. Provisional Patent Application No. 61/921,734, entitled Sacrificial Bond Pad Method, filed on Dec. 30, 2013, the disclosure of which is incorporated by reference herein in its entirety.

TECHNICAL FIELD

The present disclosure relates to a method for testing semiconductor wafers, which contain individual semiconductor devices separated by functional scribe lanes on the semiconductor wafers. The present disclosure also relates to the configuration of semiconductor wafers for testing, which contain individual semiconductor devices separated by functional scribe lanes, using a semiconductor wafer probe.

BACKGROUND

In the manufacture of semiconductors, many individual semiconductor devices are formed on a single semiconductor wafer. FIG. 1 provides an illustration of a circular semiconductor wafer 100 that includes a plurality of rectangular individual semiconductor devices. Each individual semiconductor device 200 on the semiconductor wafer 100 generally includes a series of individual bond pads along the outside perimeter of each individual semiconductor device. FIG. 2 provides an enhanced illustration of one of the individual semiconductor devices on the semiconductor wafer. FIG. 3 shows the series of individual bond pads along the outside perimeter of the individual semiconductor device. The individual bond pads are shown as the series of white squares along the outside perimeter of the individual semiconductor device.

Spaces, which are referred to as "scribe lanes," are provided between the individual semiconductor devices on the semiconductor wafer. Any one singular space is referred to as a "scribe lane." Scribe lanes generally represent unused space on the semiconductor wafer. Thus, the size of the scribe lanes is generally kept to a minimal size so that a maximum number of individual semiconductor devices may be included in each semiconductor wafer. FIG. 4 provides an illustration of "scribe lanes," which includes an identification of both vertical scribe lanes 401 and horizontal scribe lanes 402. The "scribe lanes" are destroyed when the individual semiconductor devices 200 are separated from each other when the semiconductor wafer 100 undergoes "singulation." Singulation is a cutting process that separates the individual semiconductor devices from each other by cutting the semiconductor wafer 100 along the "scribe lanes." The singulation cutting process is generally performed by either a diamond tipped saw blade or a laser cutter.

The one conventional exception to the scribe lane being an unused space on the semiconductor wafer is in the circumstance when the semiconductor wafer fabrication facility places test structures in selected scribe lanes. These test structures are used to collect data that is used to monitor the testing and to verify compliance of the fabrication facility's fabrication equipment, testing systems, and testing processes with established fabrication and testing parameters. Typically, there are five test structures placed in scribe lanes in a semiconductor wafer, which are generally located near the center of the semiconductor wafer and in each of the four quadrants of the semiconductor wafer.

An illustration of an integrated circuit package 500 showing how the various bond pads are connected to an integrated circuit in an individual semiconductor device is provided in FIG. 5A. In FIG. 5A, the integrated circuit 501 is connected through gold bond wires 502 to the bond pads. The bond pads are located in an area identified as an integrated circuit package lead frame 503. The integrated circuit package lead frame 503 includes pins and their contacts that allow the integrated circuit 501 to connect to a printed circuit board in which it is placed. FIG. 5B provides an illustration of how the bond wires 502 attach to the integrated circuit 501, e.g., printed circuit board 506. As shown in FIG. 5B, the integrated circuit package 500 including a die 505 attached to bonding wire 502 that attaches to the IC package lead frame 503. The primary composition of the non-conductive material in the integrated circuit package 500 is a resin mould 507.

The individual semiconductor devices are generally subjected to a series of automated tests by a semiconductor testing device while they are attached to one another in the semiconductor wafer. After the automated testing of the semiconductor wafer is completed, the semiconductor wafer is subjected to being cut by an automated cutting device, which frequently includes a diamond saw blade or a laser cutting tool. The automated cutting device separates the many individual semiconductor devices from one another by cutting the semiconductor wafer along the various scribe lanes, which are destroyed in the cutting process.

A semiconductor wafer probe is a device that is used in the process of testing the individual semiconductor devices that are arrayed on the semiconductor wafer. An illustration of a semiconductor wafer test system 600, using a semiconductor wafer probe 601, is illustrated in FIG. 6A and FIG. 6B. In FIG. 6A, a semiconductor wafer test system is shown that includes a large scale integrated circuit tester 602 that includes a main frame 603 having at least one programmed computer, storage devices, and input/output circuitry. The LSI tester 602 is connected by a cable 604 to a semiconductor wafer probe 601 that includes a test head 605 and a wafer handling unit 607. The test head 605 includes a probe card 607 that is connected to a performance board 608 using a spring-contact 609. The semiconductor wafer 610 being tested is placed on a wafer chuck 611, permitting the probe card to contact the semiconductor wafer 610 for testing. The test head has associated controllers to permit movement in the x, y, and z directions, as well as an angle of inclination Θ so that the probe card 607 is properly aligned with the semiconductor wafer 610 being tested. FIG. 6B shows a more detailed illustration of the probe card 607 including a ceramic ring 612 and a probe needle 608 that comes into contact with a designated normal bond pad 201 for an individual semiconductor device 200, such as an LSI chip 613.

The technological problem that arises in the semiconductor wafer probe testing process is the damage that occurs to the normal individual bonds pads 201 from coming into contact with a probe needle 608 of the wafer probe 601. Each time an individual semiconductor device 200 is probed, physical damage is caused to each normal individual bond pad 201 that is probed. The damage caused by the semiconductor wafer probe 601 to one or more normal individual bond pads 201 can cause both electrical failure and/or mechanical failure, resulting in the related individual semiconductor device 200 to function improperly or fail completely. Common electrical failures include short circuits and broken circuits. Common mechanical failures include bond wire attachment problems, and significant decreases in long-term reliability due, such as from corrosion and/or contamination.

SUMMARY

An advanced methodology for testing semiconductor wafers utilizing temporary counterpart sacrificial bond pads placed in functional scribe lanes, and the configuration of semiconductor wafers utilizing temporary counterpart sacrificial bond pads placed in functional scribe lanes, are disclosed herein. This advanced testing methodology and related semiconductor wafer configuration permits semiconductor wafer testing to be performed using the temporary counterpart sacrificial bond pads located in the scribe lanes, instead of the normal bond pads located on the individual semiconductor devices, thereby avoiding damage to the normal bond pads that would otherwise occur due to the semiconductor wafer testing process. After completion of the semiconductor wafer testing, the temporary counterpart sacrificial bond pads, which were damaged during the semiconductor wafer testing process, are destroyed during singulation of the individual semiconductor devices from the semiconductor wafer, which is implemented by cutting along the scribe lanes.

In an embodiment, a method is provided for testing a semiconductor wafer, including individual semiconductor devices located on the semiconductor wafer, using temporary counterpart sacrificial bond pads. The method includes arranging individual semiconductor devices on the semiconductor wafer in a configuration having horizontal rows of the individual semiconductor devices with a functional horizontal scribe lane between each set of two horizontal rows of individual semiconductor devices, and having vertical columns of individual semiconductor devices with a functional vertical scribe lane between each set of two vertical columns of individual semiconductor devices, where the individual semiconductor devices include normal individual bond pads along a perimeter of each individual semiconductor device. The method also includes creating a temporary counterpart sacrificial bond pad, located in a functional horizontal scribe lane or a functional vertical scribe lane, that is electrically connected to a corresponding normal individual bond pad located on an individual semiconductor device. The method further includes electrically testing a portion of the individual semiconductor device using a semiconductor wafer tester, in a semiconductor wafer probe process, that makes physical contact with the temporary counterpart sacrificial bond pad, and destroying the temporary counterpart sacrificial bond pad upon completion of the electrical testing when the individual semiconductor devices are cut from the semiconductor wafer.

In another embodiment, the method includes creating a plurality of temporary counterpart sacrificial bond pads, including a temporary counterpart sacrificial bond pad located in a functional horizontal scribe lane, and a temporary counterpart sacrificial bond pad located in a functional vertical scribe lane, each temporary counterpart sacrificial bond pad being electrically connected to a corresponding normal individual bond pad on an individual semiconductor device.

In a further embodiment, the method includes determining which of the normal individual bond pads on individual semiconductor devices are critical to the semiconductor wafer probe process, and providing a temporary counterpart sacrificial bond pad only for the normal individual bond pads on the individual semiconductor devices determined to be critical.

In an embodiment, the normal individual bond pads designed for individual semiconductor device testing are designated as critical to the semiconductor wafer probe process.

In another embodiment, the normal individual bond pads designed for supplying electrical power and providing electrical grounding are designated as critical to the semiconductor wafer probe process.

In a further embodiment, the temporary counterpart sacrificial bond pad is smaller in size than the normal individual bond pad located on an individual semiconductor device.

In an embodiment, the temporary counterpart sacrificial bond pad is approximately 50% of the size of the normal individual bond pad located on an individual semiconductor device.

In another embodiment, the temporary counterpart sacrificial bond pad is approximately 25% of the size of the normal individual bond pad located on an individual semiconductor device.

In a further embodiment, the plurality of temporary counterpart sacrificial bond pads includes an extra-large temporary counterpart sacrificial bond pad to accommodate multiple semiconductor probe card contacts for providing higher electrical power delivery to a single normal bond pad of an individual semiconductor device.

In an embodiment, temporary counterpart sacrificial bond pads for adjacent individual semiconductor devices are offset from one another, so that temporary counterpart sacrificial bond pads for adjacent individual bond pads are not located back-to-back.

In another embodiment, temporary counterpart sacrificial bond pads for adjacent individual semiconductor devices are located back-to-back.

In a further embodiment, the method includes providing a temporary counterpart sacrificial bond pad for all of the normal individual bond pads on the individual semiconductor devices.

In an embodiment, designated functional horizontal scribe lanes and designated functional vertical scribe lanes are configured to have a sufficient width to accommodate temporary counterpart sacrificial bond pads that are located back-to-back, having a non-conductive separation there between.

In another embodiment, the temporary counterpart sacrificial bond pad is electrically connected to a corresponding normal individual bond pad located on an individual semiconductor device through the use of a re-distribution layer, which is a conductive layer provided over the semiconductor wafer surface, and is otherwise electrically isolated from the individual semiconductor device.

In a further embodiment, the method includes staggering a location on the temporary counterpart sacrificial bond pad of a plurality of physical contacts between the semiconductor wafer tester and the temporary counterpart sacrificial bond pad, such that each physical contact is at a different location on the temporary counterpart sacrificial bond pad.

In an embodiment, the temporary counterpart sacrificial bond pads are smaller in size than the normal individual bond pads on the individual semiconductor devices, and the temporary counterpart sacrificial bond pads, located in a vertical and/or horizontal scribe lane between adjacent individual semiconductor devices, are arranged in a side-by-side configuration.

In another embodiment, a semiconductor wafer is configured with temporary sacrificial bond pads for testing individual semiconductor device on the semiconductor wafer. The semiconductor wafer includes individual semiconductor devices arranged on the semiconductor wafer in a configuration having horizontal rows of the individual semiconductor devices with a functional horizontal scribe lane between each set of two horizontal rows of individual semiconductor devices, and having vertical columns of individual semiconductor devices with a functional vertical scribe lane between each set of two vertical columns of individual semiconductor devices, wherein the individual semiconductor devices include normal individual bond pads along a perimeter of each individual semiconductor device. The semiconductor wafer also includes temporary counterpart sacrificial bond pads, located in one or more functional horizontal scribe lanes and/or one or more functional vertical scribe lanes, that are each electrically connected to a corresponding normal individual bond pad located on an individual semiconductor device. The temporary counterpart sacrificial bond pad is used for testing an individual semiconductor device located on the semiconductor wafer only before the individual semiconductor device is physically separated from the semiconductor wafer.

In a further embodiment, the temporary counterpart sacrificial bond pads are smaller in size than the normal individual bond pads located on the individual semiconductor devices.

In an embodiment, each temporary counterpart sacrificial bond pad is electrically connected to a corresponding normal individual bond pad located on an individual semiconductor device through the use of a re-distribution layer, which is a conductive layer provided over the semiconductor wafer surface, and is otherwise electrically isolated from the individual semiconductor device.

In another embodiment, temporary counterpart sacrificial bond pads for adjacent individual semiconductor devices are offset from one another, so that counterpart sacrificial bond pads for adjacent individual bond pads are not located back-to-back in a vertical scribe lane or a horizontal scribe lane.

DETAILED DESCRIPTION

Figure 1:
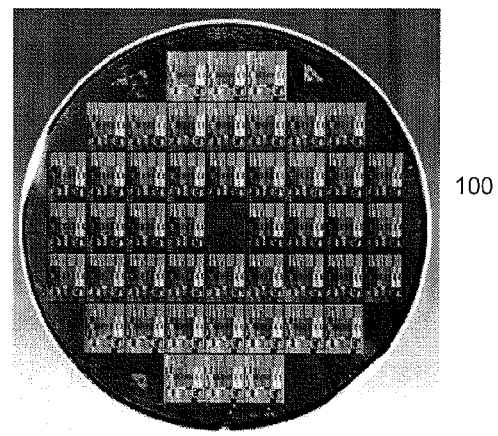
FIG. 1 provides an illustration of a circular semiconductor wafer that includes a plurality of rectangular individual semiconductor devices.
Figure 2:
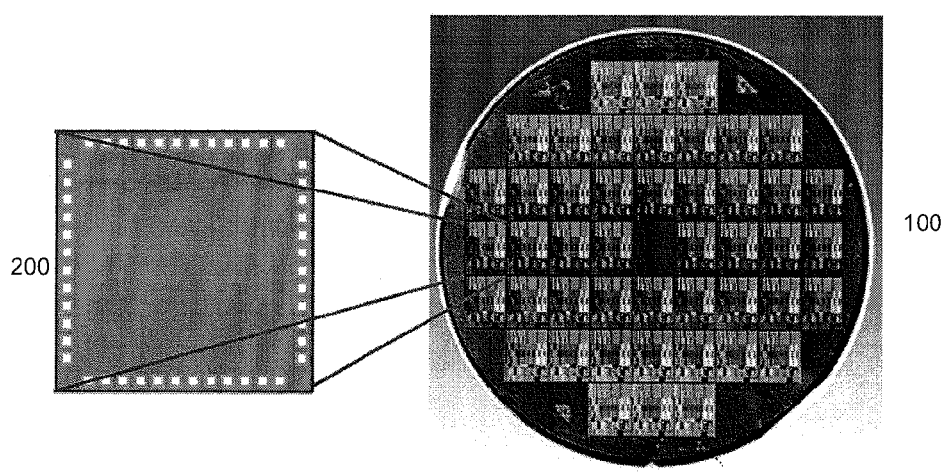
FIG. 2 provides an enhanced illustration of one of the individual semiconductor devices on the semiconductor wafer.
Figure 3:
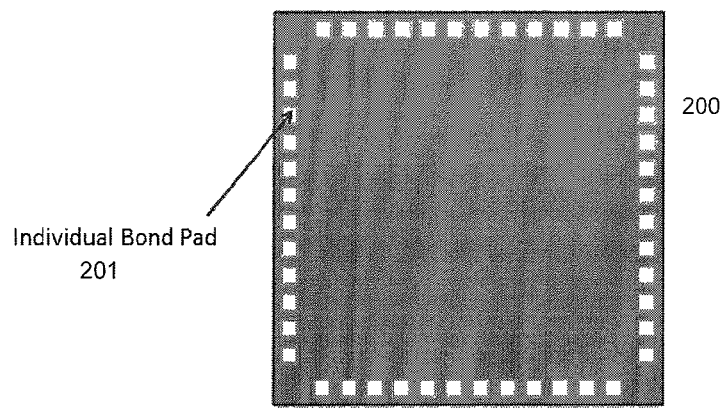
FIG. 3 shows the series of individual bond pads along the outside perimeter of the individual semiconductor device.
Figure 4:
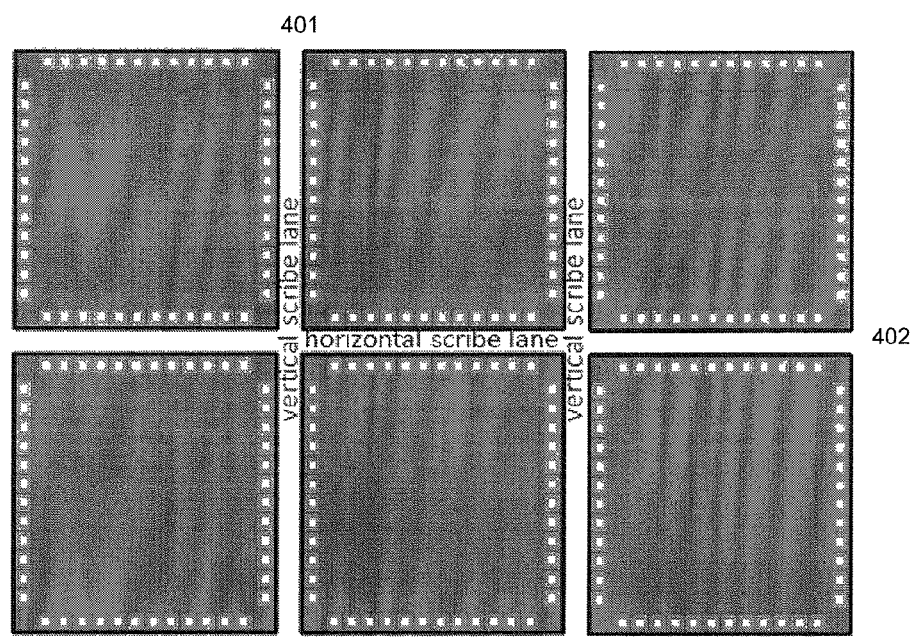
FIG. 4 provides an illustration of "scribe lanes"
Figure 5A:
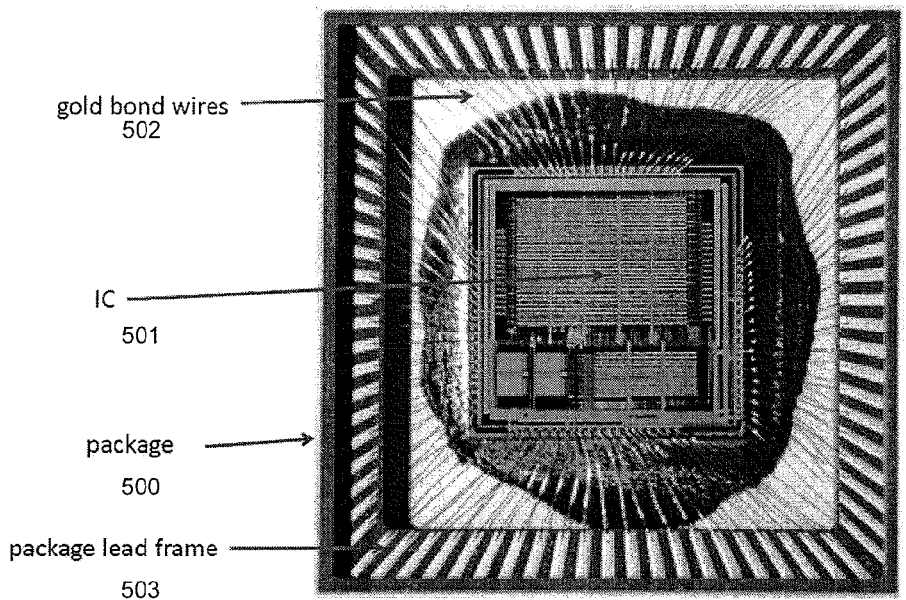
FIG. 5A provides an illustration of how bond wires may be connected to a package lead frame.
Figure 5B:
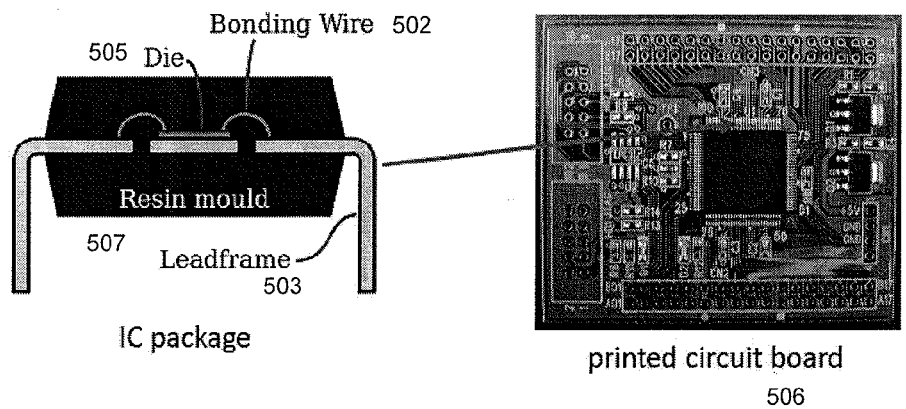
FIG. 5B illustrate how bond wires may be attached to package pins.

In view of the foregoing, the present disclosure, through one or more of its various aspects, embodiments and/or specific features or sub-components, is thus intended to bring out one or more of the advantages as specifically noted below. The present disclosure provides a description of an advanced methodology for testing semiconductor wafers utilizing temporary counterpart sacrificial bond pads placed in functional scribe lanes, and the configuration of semiconductor wafers utilizing temporary counterpart sacrificial bond pads placed in functional scribe lanes for testing purposes.

In generating the disclosed inventive solution to the problem of damage to the individual semiconductor devices 200 caused the semiconductor wafer probe process for testing semiconductor wafers 100, many design factors were considered. For instance, consideration was given to having the probe card 607 having a lower contact force, a smaller scrub area, and/or a shallower scrub depth. Additionally, in the integrated circuit design, consideration was given to providing a more robust individual bond pad 201 design, as well as the provision of stronger materials that would resist damage. Furthermore, consideration was given to the packaging and the design of the various interconnections. These considerations included providing better adhesion between the bond wire 502 and an individual bond pad 201, reducing the stress on the individual bond pad 201 from the bond wire 502 itself, and providing better protection from contaminates that can penetrate through cracks and other damaged areas due to wafer probing.

Other engineering considerations included limiting the number of wafer probe touchdowns to minimize the damage from the wafer probe 601 and to keep the damage within acceptable limits. Although incremental, some level of damage is unavoidable with each contact between the wafer probe mechanism and the individual bond pad. Thus, in addition to limiting the actual number of wafer probe touchdowns, consideration was also given to the force associated with each wafer probe touchdown and the contact pattern caused by wafer probes contacting the individual bond pads. For instance, cantilevered probe cards are generally limited to three wafer probe touchdowns. Vertical wafer probes are generally limited to five wafer probe touchdowns. Micro Electro-Mechanical (MEM) probe cards, which utilize semiconductor fabrication methods to create extremely small electromechanical systems, may be used for five or possibly more wafer probe touchdowns.

In considering wafer probe touchdown requirements in the actual testing of semiconductor wafers, both Parallel Concurrent Probe (PCP) semiconductor wafer testing and Dynamically Expanded Parallel Probe (DEPP) testing require multiple touchdowns per individual semiconductor device. In general, the greater the increase in semiconductor wafer testing throughput, the greater the number of touchdowns of the wafer probe is required. However, in analyzing the semiconductor wafer testing process, it was determined that touchdowns of the wafer probe 601 during semiconductor testing are not required for every individual bond pad 201 on an individual semiconductor device 200. More specifically, touchdowns of the wafer probe 601 are generally restricted to power bond pads, ground bond pads, and Design For Test (DFT) bond pads. DFT technology is used to describe a broad range of semiconductor test methodologies that operate efficiently, while avoiding alternative brute force procedures that require an individual semiconductor device to operate in a full operational mode as it would during actual operation.

The invention disclosed herein involves the development of an advanced methodology for testing semiconductor wafers utilizing temporary counterpart sacrificial bond pads placed in functional scribe lanes, and the configuration of semiconductor wafers utilizing temporary counterpart sacrificial bond pads placed in functional scribe lanes.

Figure 7A:
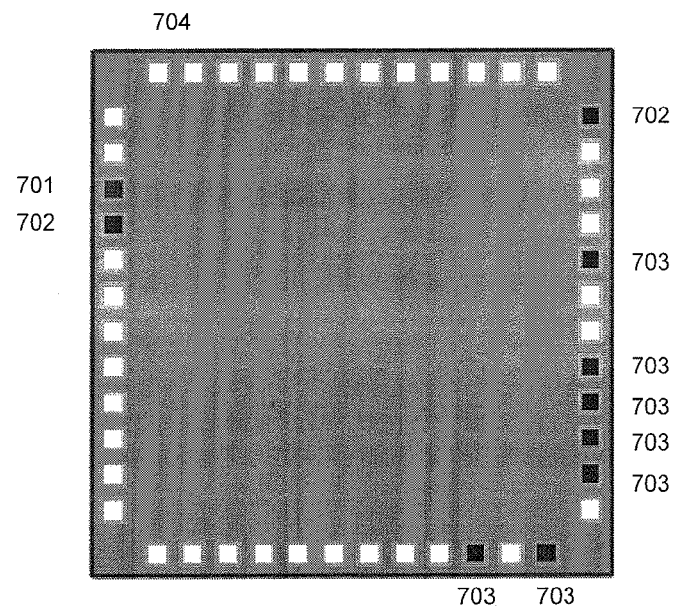
FIG. 7A provides an illustration of how only a limited number of the normal bond pads on an individual semiconductor device may be considered to be critical for testing purposes.

After determining that touchdowns of the wafer probe are generally restricted to power bond pads, ground bond pads, and DFT bond pads, it was further determined that these particular bond pads represent critical bond pads that are more frequently damaged by the semiconductor wafer probe process. A further determination was made that the total number of power bond pads, ground bond pads, and DFT bond pads is generally relatively small in comparison to the total number of individual bond pads that are provided along the perimeter of an individual semiconductor device. An exemplary assignment of power bond pads 701, ground bond pads 702, DFT bond pads 703 and all other individual bond pads is illustrated in FIG. 7A. As shown in FIG. 7A, the total number of critical bond pads that are more frequently damaged by the semiconductor wafer probe process is small.

Figure 7B:
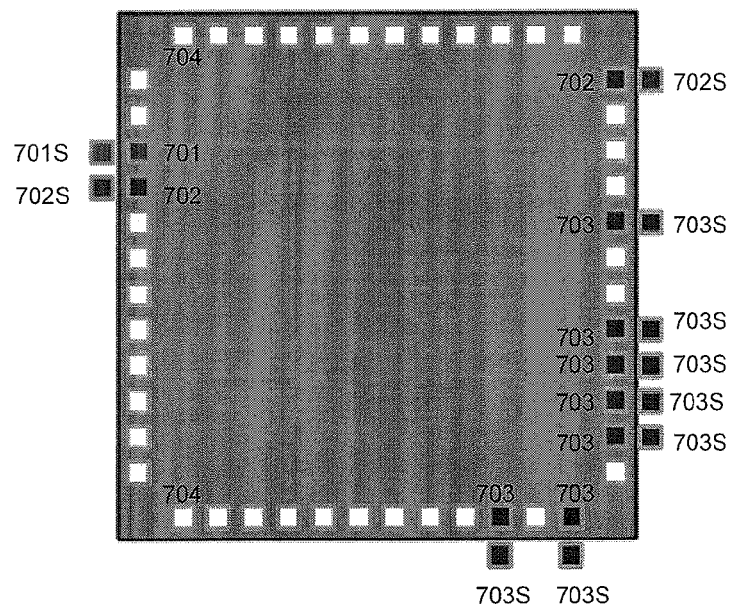
FIG. 7B illustrates how temporary counterpart sacrificial bond pads correspond to the limited number of normal bond pads on an individual semiconductor device that are considered to be critical for testing purposes, which are illustrated in FIG. 7A.

Thus, one aspect of the present invention is to create one or more temporary "sacrificial bond pads" that are corresponding counterparts to the aforementioned critical bond pads. Temporary counterpart sacrificial bond pads may be created for one or more of the identified critical bond pads. For example, temporary counterpart sacrificial bond pads may be created for all of the corresponding critical bond pads. Alternatively, temporary counterpart sacrificial bond pads may be created for only a subset of the identified critical bond pads, such as for DFT bond pads. An exemplary illustration of the creation of temporary counterpart sacrificial bond pads for corresponding critical bond pads is illustrated in FIG. 7B. In FIG. 7B, a temporary counterpart sacrificial bond pad has been created for each corresponding critical bond pad. For instance, temporary counterpart sacrificial power bond pad 701S corresponds to power bond pad 701. Temporary counterpart sacrificial ground bond pads 702S correspond to ground bond pads 702. Temporary counterpart sacrificial DFT bond pads 703S correspond to DFT bond pads 703. On the other hand, none of the remaining non-critical bond pads 704 has a temporary counterpart sacrificial bond pad. A connection between each critical bond pad with each corresponding temporary counterpart sacrificial bond pad is made with a metal conductor located on the "top metal layer" of the individual semiconductor device.

Additionally, because the temporary counterpart sacrificial bond pads are only used temporarily, such as during one or more of the semiconductor wafer probes, the counterpart sacrificial bond pads may be the same size as the corresponding critical bond pads, or they may be smaller in size than the corresponding critical bond pads, because temporary counterpart sacrificial bond pads are used only for probing. They are not used for bond-wire attachment during the subsequent assembly process. For instance, the size of the temporary counterpart sacrificial bond pads may be determined based on the estimated number of touchdowns of a semiconductor probe that they may encounter. Thus, the temporary counterpart sacrificial bond pads may only be approximately one-half (50%) of the size of their corresponding critical bond pads. In some instances, the temporary counterpart sacrificial bond pads may be only one-fourth (25%) of the size of their corresponding counterpart sacrificial bond pads. Furthermore, in some instances the counterpart sacrificial bond pads may not be all the same size, but may be created in different sizes dependent upon expected usage considerations, etc. In some instances, more than one temporary counterpart sacrificial bond pad may be created to correspond to a single normal bond pad along a perimeter of an individual semiconductor device.

In some instances, multiple semiconductor wafer probe card resources (probe card contacts) may be connected to a single individual semiconductor device bond pad cell (normal bond pad cell) so that more electrical power may be delivered to the individual semiconductor device. Probe card contacts have a specified maximum electrical current that they can carry. This limitation limits the amount of electrical power that an individual semiconductor probe card contact can deliver to the individual semiconductor device during testing. Typically, in order to test an individual semiconductor device in the minimum amount of time, the individual semiconductor device will have a certain defined electrical power requirement. If the semiconductor test system is unable to deliver this required amount of electrical power, however, then the semiconductor testing must be slowed in order to avoid false test results due to the individual semiconductor device being underpowered during testing (power starved). With large, high pin-count devices, it is common for the testing to be intentionally slowed due to the known limitations in the electrical power delivery of the semiconductor test interface hardware. The temporary counterpart sacrificial bond pad method allows for either multiple temporary counterpart sacrificial bond pads, or a single large temporary counterpart sacrificial bond pad, to provide multiple current paths between the semiconductor tester and a power pad or ground pad on the individual semiconductor device under test. For example, if each individual semiconductor probe card contact can handle 1 A of electrical current, then being able to have two semiconductor probe contacts connected to the individual semiconductor device's power pad cell would double the available electrical current at 2 A. This additional electrical power can be utilized for faster and more efficient testing of the individual semiconductor device. This additional electrical power thus translates into lower individual semiconductor test times, which results in lower testing costs. A key point in the above-described configuration variation is that the temporary sacrificial bond pads may be configured, either singularly or in combination, to be extra-large in total size to accommodate multiple probe card contacts for higher electrical power delivery to a single bond pad (pad cell) of an individual semiconductor device Additionally, other factors need to be considered in determining the minimum dimensions for the temporary counterpart sacrificial bond pads. These additional factors include considerations regarding making sure that the temporary counterpart sacrificial bond pads meet the specifications for the probe card contact mechanism to be employed. For instance, some semiconductor probe cards use a cantilevered needle or paddle. Other semiconductor probe cards use a vertical needle, using a point or star configuration. Still other semiconductor probe cards use a micro electro-mechanical system (MEMS), which may require a pointed or flat contact. Furthermore, the contact force of the semiconductor probe card will also play a role in determining the minimum thickness for the temporary counterpart sacrificial bond pads. Also, the scrubbing area also plays a role in determining the minimum surface area, e.g., in a worst-case scenario, the outer diameter of the semiconductor wafer probe mark would determine the minimum surface area. Further, the semiconductor probe placement accuracy across the semiconductor wafer is an important consideration. This factor adds to the minimum area established by scrub marks. Furthermore, the minimum pitch of the semiconductor wafer probe contactor may further increase the minimum area or decrease the maximum area.

Figure 8:
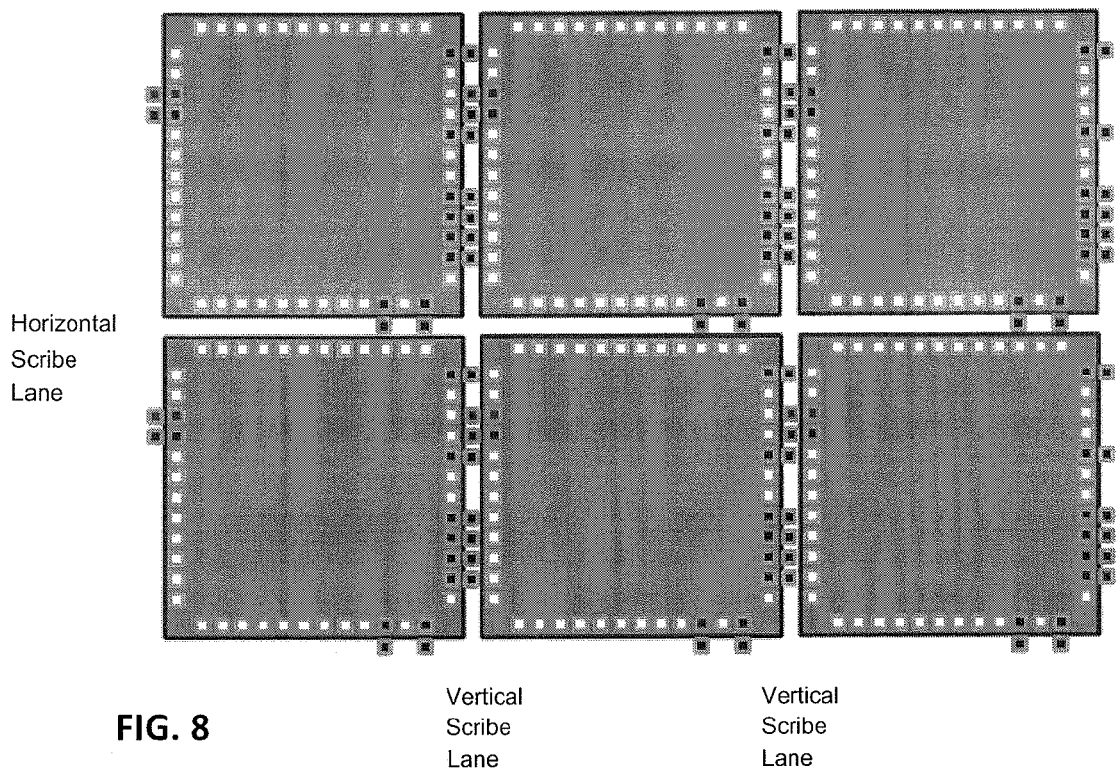
FIG. 8 illustrates how the temporary counterpart sacrificial bond pads correspond to normal bond pads, and how the temporary counterpart sacrificial bond pads are located in the vertical and horizontal scribe lanes on the semiconductor wafer.

An exemplary illustration of the creation of temporary counterpart sacrificial bond pads 701S, 702S, and 703S that correspond to critical bond pads 701, 702, and 703, respectively, is provided in FIG. 8. In FIG. 8, the counterpart sacrificial bond pads are located in various horizontal and vertical scribe lanes. To conserve space, temporary counterpart sacrificial bond pads for adjacent individual semiconductor devices are offset from one another, so that temporary counterpart sacrificial bond pads for adjacent individual bond pads are not located back-to-back. In this configuration, the vertical and horizontal scribe lanes need only to be slightly larger than the size of a largest temporary counterpart sacrificial bond pad.

There are a variety of ways in which the temporary counterpart sacrificial bond pads may be connected to their corresponding critical bond pad. One particularly effective way is through the use of a Re-Distribution Layer (RDL). RDL refers to a top level metal layer of the individual semiconductor device that is used to perform last step interconnections. More specifically, redistribution requires adding another conductive layer over the semiconductor wafer surface, which is patterned and metallized to provide new counterpart sacrificial bond pads at designated locations. This additional conductive layer is electrically isolated from the semiconductor wafer, except for the connections with the original bond pads.

Figure 9A:
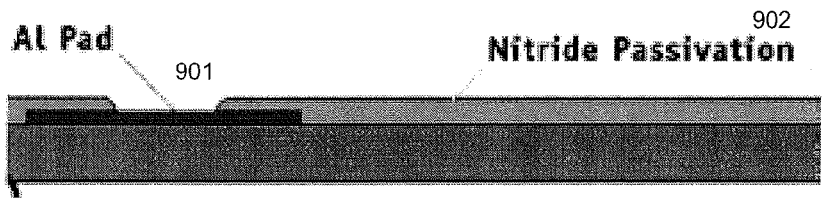
FIGS. 9A, 9B, 9C, and 9D show exemplary illustrations of the creation of a re-distribution conductive layer that connects a "normal" bond pad with a corresponding temporary counterpart sacrificial bond pad, which is otherwise electrically isolated from the individual semiconductor device on the semiconductor wafer.
Figure 9B:
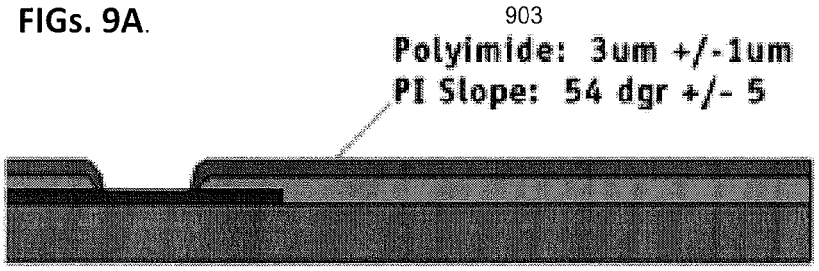
Figure 9C:
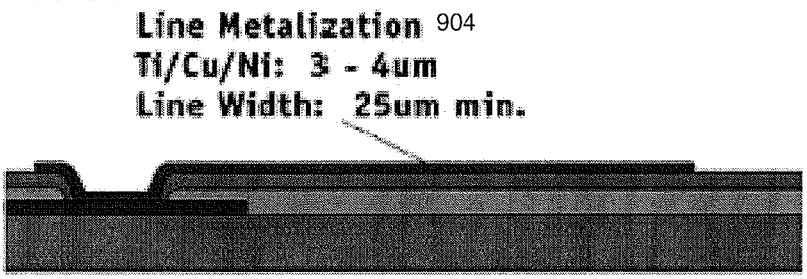
Figure 9D:
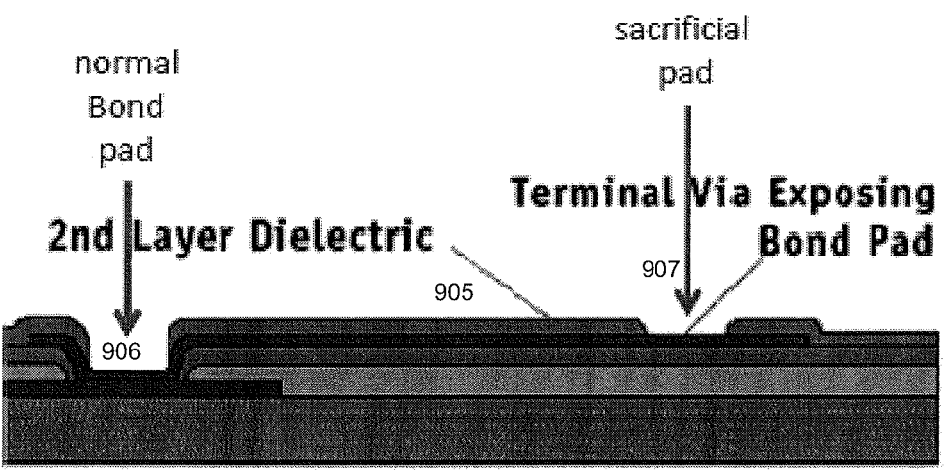

FIGS. 9A, 9B, 9C, and 9D show exemplary illustrations of the creation of a re-distribution conductive layer that connects a "normal" bond pad with a corresponding temporary counterpart sacrificial bond pad, which is otherwise electrically isolated from the individual semiconductor device on the semiconductor wafer. In FIG. 9A, a normal metallic bond pad 901 provided on an individual semiconductor element 201 is partially covered with a nitride passivation layer 902. In FIG. 9B, the nitride passivation layer 902 is covered with a polyimide layer 903 having a thickness of approximately 3 µm. In FIG. 9C, an electrically conductive metal line 904, having a minimum width of at least 25 µm, is provided over the polyimide layer. In FIG. 9D, a second dielectric layer 905 is provided over the electrically conductive metal line 904, except for openings exposing the electrically conductive metal line 904 at the location of the normal bond pad 906 on an individual semiconductor device and at the location of the corresponding counterpart sacrificial bond pad 907 located in a scribe lane on the semiconductor wafer.

A further refinement of the above-described process for minimizing the physical damage to the individual bond pads and/or the corresponding temporary counterpart sacrificial bond pads is to engineer the semiconductor wafer probe testing process to stagger the semiconductor wafer probe needles so that they have different coordinates on a designated bond pad for each touchdown of the semiconductor wafer probe needle with the designated bond pad. This process provides a different touchdown location on the designated bond pad for each touchdown. Thus, the physical damage to the designated bond pad is distributed over a wider surface area of the designated bond pad, and avoids more serious physical damage to the designated bond pad that would occur if a same touchdown location is used repetitively by the semiconductor wafer probe needle. Thus, each of the bond pads subjected to the semiconductor wafer probe testing would have probe damage due to touchdowns in a distributed location pattern.

Figure 10:
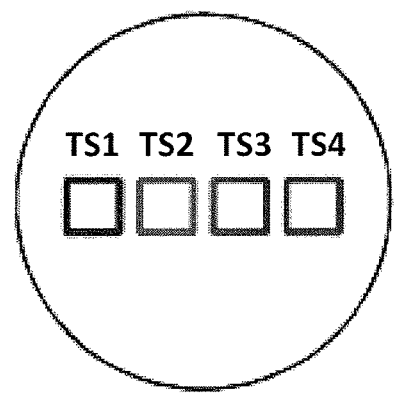
FIG. 10 provides an exemplary illustration of the use of several different semiconductor probe test sites on a temporary counterpart sacrificial bond pad.

An exemplary illustration of the use of several different semiconductor wafer probe test sites so that they have different coordinates on a designated bond pad for each touchdown of a semiconductor wafer probe needle with the designated bond pad is provided in FIG. 10. In FIG. 10, four different possible test sites TS1, TS2, TS3, and TS4 are illustrated that may be utilized for different testing purposes, which may include DFT testing, power testing, ground testing, and other types of testing.

Figure 11:
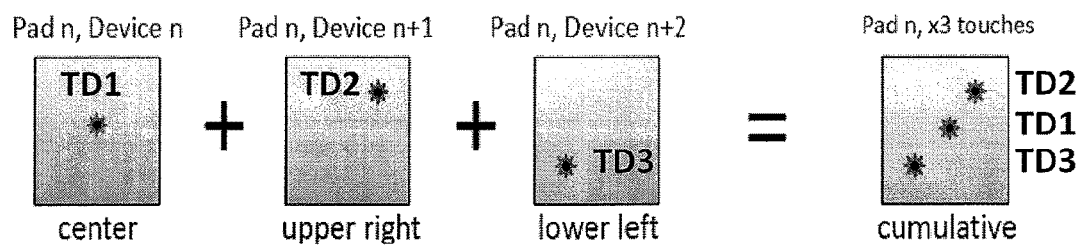
FIG. 11 illustrates a staggered pattern using different semiconductor probe test sites on a temporary counterpart sacrificial.

FIG. 11 illustrates a staggered pattern using different coordinates so that the probe card needles have different test site locations on an individual bond pad. In FIG. 11, the first touchdown site TD1 on bond pad n by semiconductor wafer probe device n is located at the center of the designated bond pad n. The second touchdown site TD2 on bond pad n by semiconductor wafer probe device n+1 is located in the upper right corner of the bond pad n. The third touchdown site TD3 on bond pad n by semiconductor wafer probe device n+2 is located in the lower left corner to the bond pad n. Thus, the cumulative damage to the designated bond pad n exhibits a distributed cumulative physical damage pattern, thereby avoiding more serious physical damage that would have occurred if a staggered semiconductor wafer probe needle pattern were not employed.

Figure 12:
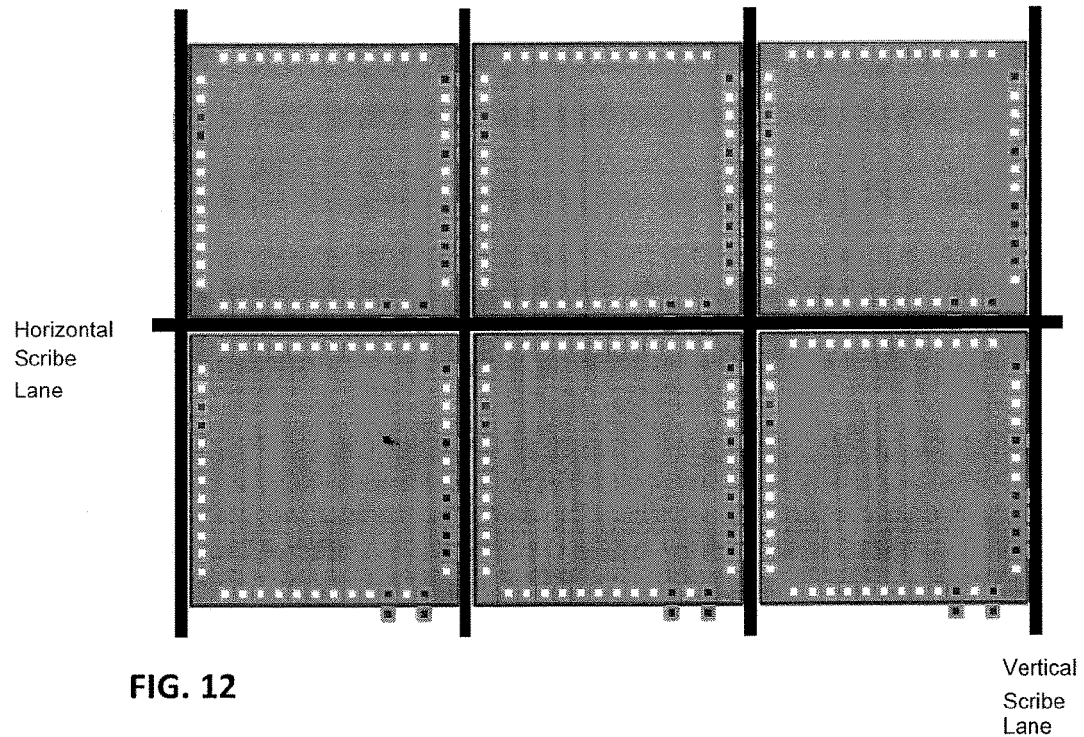
FIG. 12 shows black lines in the various vertical scribe lines and horizontal scribe lanes that represent where the semiconductor wafer cutting device saws the semiconductor wafer into individual semiconductor devices after the semiconductor wafer probe testing process is completed.

FIG. 12 shows black lines in the various vertical scribe lanes and horizontal scribe lanes that represent where the semiconductor wafer cutting device saws the semiconductor wafer into individual semiconductor devices after the semiconductor wafer probe testing process is completed. Since the cutting device follows the scribe lanes, the temporary counterpart sacrificial bond pads are destroyed during the cutting process. The destruction of the temporary counterpart sacrificial bond pads is of no consequence since the primary purpose for which they were created was completed during the semiconductor wafer probe testing process. This process, however, has prevented the "normal" individual bond pads on each of the individual semiconductor devices from being physically damaged, which may have resulted in electrical and/or mechanical failure of the "normal" individual bond pads. Damage to the "normal" individual bond pads would have certainly occurred had the temporary counterpart sacrificial bond pads not been created and used.

A variation of the above-described advanced configuration of semiconductor wafers having enhanced functional scribe lanes, and the process for generating the advanced configuration of semiconductor wafers having enhanced functional scribe lanes will now be described. In this variation, instead of pairing only the critical individual bond pads required for testing, all of the individual bond pads on each individual semiconductor device are paired with a temporary counterpart sacrificial bond pad.

Figure 13:
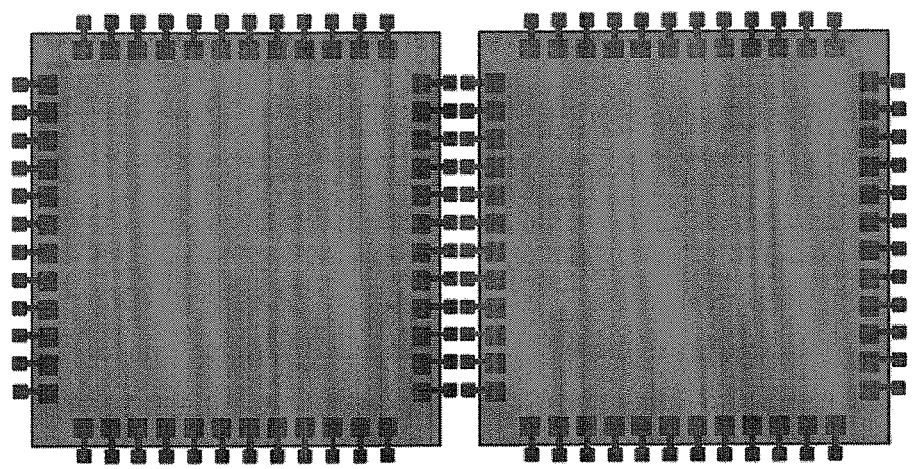
FIG. 13 shows a configuration of counterpart sacrificial bond pads wherein all of the individual bond pads along a designated perimeter on adjacent individual semiconductor devices are paired with a counterpart sacrificial bond pad.

In this variation, the requirement is that the temporary counterpart sacrificial bond pads for adjacent individual semiconductor devices must fit back-to-back within each internal scribe lane. Thus, in this configuration the designated scribe lanes must be twice their normal size in order to accommodate two back-to-back temporary counterpart sacrificial bond pads. This configuration is illustrated in FIG. 13. The size of the scribe lanes in this configuration, however, may be made smaller when the corresponding counterpart sacrificial bond pads are made smaller in size relative to the size of a normal individual bond pad. In certain instances, the temporary counterpart sacrificial bond pads need only be large enough to allow for a semiconductor wafer probe needle to make physical contact. When repetitive touchdowns of the semiconductor wafer probe needle are permitted at the same physical location on a corresponding counterpart sacrificial bond pad, the temporary counterpart sacrificial bond pad may be reduced to approximately one-fourth (25%) of the size of a corresponding normal individual bond pad.

This configuration may be used in general probing of all areas of the individual semiconductor devices undergoing testing, because each individual bond pad has a corresponding temporary counterpart sacrificial bond pad to absorb the physical damage incurred due to touchdowns by the semiconductor wafer probe. Thus, the benefit is the complete elimination of most of the significant issues related to damage to the normal individual bond pads during the semiconductor wafer probe testing.

Figure 14:
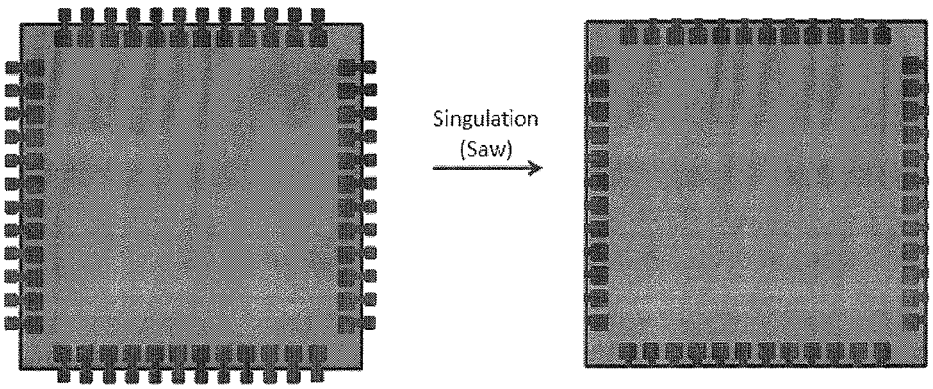
FIG. 14 illustrates pre-cutting and post-cutting configurations of an individual semiconductor device having normal bond pads and corresponding counterpart sacrificial bond pads subjected to the semiconductor wafer cutting process.
Figure 15:
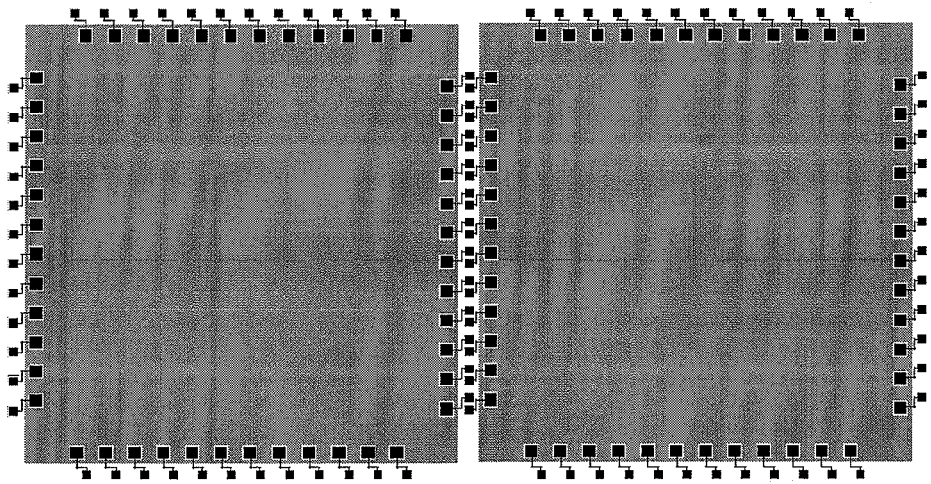
FIG. 15 shows a configuration of the counterpart sacrificial bond pads wherein the counterpart sacrificial bond pads are configured to be smaller in size than the normal individual bond pads and are place in a staggered configuration.

FIG. 14 illustrates a pre-cutting configuration of an individual semiconductor device having normal bond pads and corresponding counterpart sacrificial bond pads before being subjected to the semiconductor wafer cutting process (Left Side of FIG. 14). FIG. 14 also illustrates the post-cutting configuration of an individual semiconductor device having normal bond pads and removed corresponding counterpart sacrificial bond pads after being subjected to the semiconductor wafer cutting process (Right Side of FIG. 14);

Another variation of the above-described advanced configurations of semiconductor wafers having enhanced functional scribe lanes and the process for generating the advanced configuration of semiconductor wafers having enhanced functional scribe lanes will now be described. In this further configuration variation, which is illustrated in FIG. 15, the temporary counterpart sacrificial bond pads are configured to be smaller in size that the normal individual bond pads and are placed in a staggered configuration. In this staggered configuration, the reduced-size temporary counterpart sacrificial bond pads may be located side-by-side. Thus, the scribe lanes may also be reduced in size.

Figure 16:
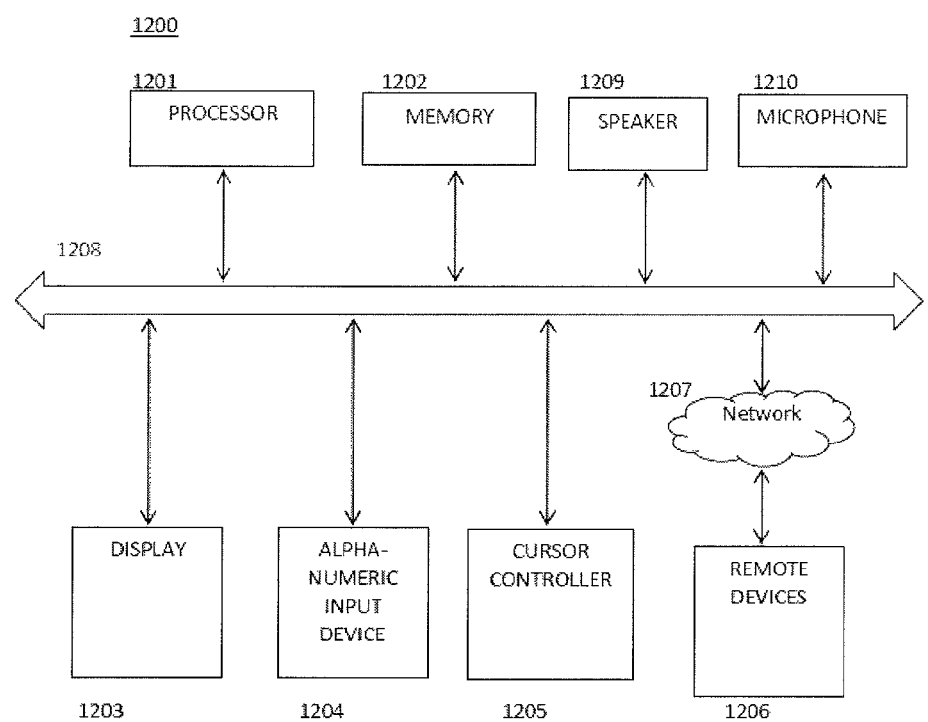
FIG. 16 illustrates an example of a computer in which the semiconductor wafer probe testing processes described herein may be processed.

FIG. 16 illustrates an example of a computer 1200 on which the semiconductor wafer probe testing processes described above may be implemented. The computer 1200 includes one or more sets of computer programming instructions that are stored in memory 1202 and that can be executed by processor 1201 in computer 1200 to perform the process described above. Computer 1200, which when properly programmed with specific testing software, becomes a special purpose computer that is configured for a specialized set of testing operations and functions.

Figure 6A:
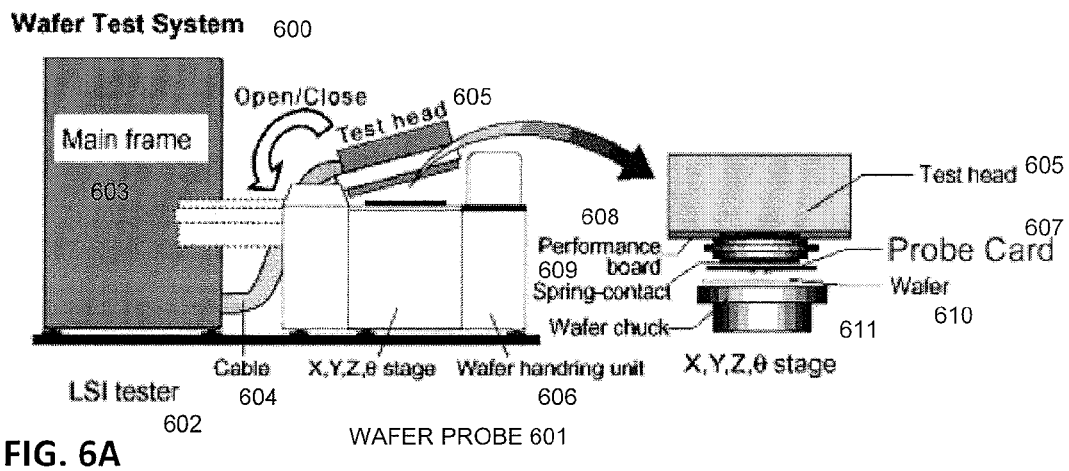
FIG. 6A illustrates a semiconductor wafer probe system used in testing semiconductor wafers.
Figure 6B:
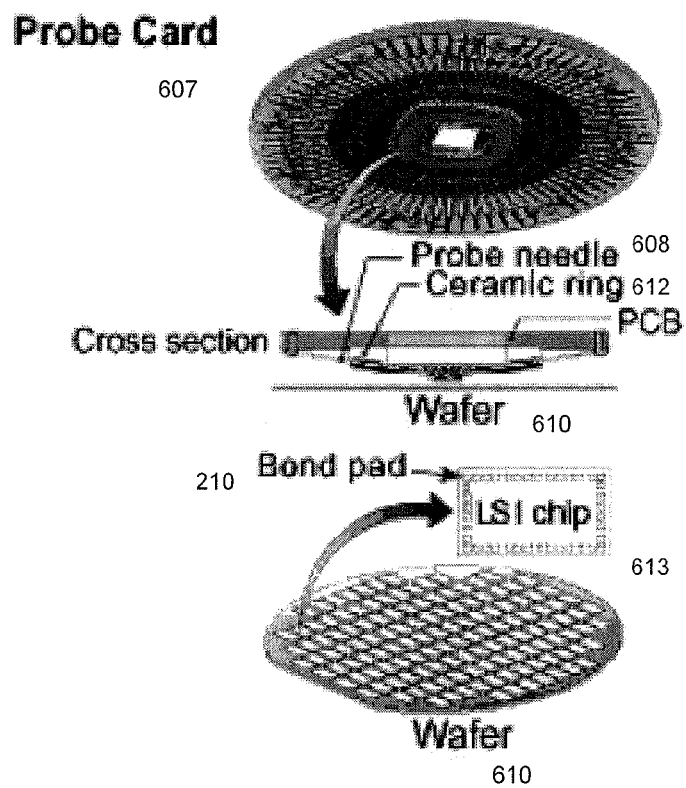
FIG. 6B provides a more detailed illustration of the semiconductor probe card.

The computer utilized in semiconductor test system illustrated in FIG. 6A and FIG. 6B may be present in one of many physical configurations, including being configured as a server or as a client terminal. The computer may also be associated with various devices, such as a desk-top computer, a laptop computer, a personal digital assistant, a mobile device, an electronic tablet, a smart phone, etc.

As illustrated in FIG. 16, the computer 1200 includes a processor 1201 and memory 1202, which is representative of one or more various memories that may be used by the computer 1200. These memories may include one or more random access memories, read only memories, and programmable read only memories, etc. Computer 1200 also includes at least one display 1203, which may be provided in any form, including a cathode ray tube, a LED display, an LCD display, and a plasma display, etc. The display may include provisions for data entry, such as by a touch-sensitive screen. Additional output devices may include an audio output device, such as a speaker 1209.

Computer 1200 further includes one or more input devices. Input devices may include one or more of an alpha-numeric input device 1204, such as a keyboard; a cursor controller 1205, such as a mouse, touch-pad, or joy-stick; and a microphone 1210. Computer 1200 also enables processor 1201 to communicate with one or more remote devices 1206 over a network 1207 external to computer 1200. Communications internal to computer 1200 primarily use bus 1208.

In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

Although the invention has been described with reference to several exemplary embodiments, it is understood that the words that have been used are words of description and illustration, rather than words of limitation. Changes may be made within the purview of the appended claims, as presently stated and as amended, without departing from the scope and spirit of the invention in its aspects. Although the invention has been described with reference to particular means, materials and embodiments, the invention is not intended to be limited to the particulars disclosed; rather the invention extends to all functionally equivalent structures, methods, and uses such as are within the scope of the appended claims.

While the non-transitory computer-readable medium may be shown to be a single medium, the term "computer-readable medium" includes a single medium or multiple media, such as a centralized or distributed database, and/or associated caches and servers that store one or more sets of instructions. The term "non-transitory computer-readable medium" shall also include any medium that is capable of storing, encoding or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to capture carrier wave signals such as a signal communicated over a transmission medium. Accordingly, the disclosure is considered to include any computer-readable medium or other equivalents and successor media, in which data or instructions may be stored.

Although the present specification describes components and functions that may be implemented in particular embodiments with reference to particular standards and protocols, the disclosure is not limited to such standards and protocols. For example, standards for Internet and other packet-switched network transmission represent examples of the state of the art. Such standards are periodically superseded by faster or more efficient equivalents having essentially the same functions. Accordingly, replacement standards and protocols having the same or similar functions are considered equivalents thereof.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately-claimed subject matter.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A method for testing a semiconductor wafer, including individual semiconductor devices located on the semiconductor wafer, using temporary counterpart sacrificial bond pads, the method comprising:
arranging individual semiconductor devices on the semiconductor wafer in a configuration having horizontal rows of the individual semiconductor devices with a functional horizontal scribe lane between each set of two horizontal rows of individual semiconductor devices, and having vertical columns of individual semiconductor devices with a functional vertical scribe lane between each set of two vertical columns of individual semiconductor devices, wherein the individual semiconductor devices include normal individual bond pads along a perimeter of each individual semiconductor device;
determining which of the normal individual bond pads on individual semiconductor devices are critical to a semiconductor wafer testing probe process based on a determination that critical bond pads are more frequently damaged by the semiconductor wafer testing probe process;

providing temporary counterpart sacrificial bond pads only for the normal individual bond pads on the individual semiconductor devices determined to be critical bond pads;

electrically testing a portion of the individual semiconductor device using a semiconductor wafer tester executing the semiconductor wafer testing probe process that uses a semiconductor wafer probe that makes physical contact with the temporary counterpart sacrificial bond pads; and destroying the temporary counterpart sacrificial bond pads upon completion of the electrical testing when the individual semiconductor devices are cut from the semiconductor wafer.

2. The method for testing a semiconductor wafer according to claim 1,
wherein normal individual bond pads designed for individual semiconductor device testing are designated as critical to the semiconductor wafer testing probe process.

3. The method for testing a semiconductor wafer according to claim 1,
wherein normal individual bond pads designed for supplying electrical power and providing electrical grounding are designated as critical to the semiconductor wafer testing probe process.

4. A method for testing a semiconductor wafer, including individual semiconductor devices located on the semiconductor wafer, using temporary counterpart sacrificial bond pads, the method comprising:

arranging individual semiconductor devices on the semiconductor wafer in a configuration having horizontal rows of the individual semiconductor devices with a functional horizontal scribe lane between each set of two horizontal rows of individual semiconductor devices, and having vertical columns of individual semiconductor devices with a functional vertical scribe lane between each set of two vertical columns of individual semiconductor devices, wherein the individual semiconductor devices include normal individual bond pads along a perimeter of each individual semiconductor device;

creating a plurality of temporary counterpart sacrificial bond pads, including a temporary counterpart sacrificial bond pad located in a functional horizontal scribe lane and a temporary counterpart sacrificial bond pad located in a functional vertical scribe lane, each temporary counterpart sacrificial bond pad being electrically connected to a corresponding normal individual bond pad on an individual semiconductor device;

electrically testing a portion of an individual semiconductor device using a semiconductor wafer tester, in a semiconductor wafer probe process, that makes physical contact with the temporary counterpart sacrificial bond pad; and destroying the temporary counterpart sacrificial bond pad upon completion of the electrical testing when the individual semiconductor devices are cut from the semiconductor wafer, wherein the plurality of temporary counterpart sacrificial bond pads includes at least one extra-large temporary counterpart sacrificial bond pad to accommodate multiple semiconductor probe card contacts for providing higher electrical power delivery to a single normal bond pad of an individual semiconductor device.

5. The method for testing a semiconductor wafer according to claim 4,
wherein the temporary counterpart sacrificial bond pad is smaller in size than the normal individual bond pad located on an individual semiconductor device.

6. The method for testing a semiconductor wafer according to claim 4,
wherein the temporary counterpart sacrificial bond pad is approximately 50% of the size of the normal individual bond pad located on an individual semiconductor device.

7. The method for testing a semiconductor wafer according to claim 4,
wherein the temporary counterpart sacrificial bond pad is approximately 25% of the size of the normal individual bond pad located on an individual semiconductor device.

8. The method for testing a semiconductor wafer according to claim 4,
wherein temporary counterpart sacrificial bond pads for adjacent individual semiconductor devices are offset from one another, so that temporary counterpart sacrificial bond pads for adjacent individual bond pads are not located back-to-back.

9. The method for testing a semiconductor wafer according to claim 4,
wherein temporary counterpart sacrificial bond pads for adjacent individual semiconductor devices are located back-to-back.

10. The method for testing a semiconductor wafer according to claim 4, further comprising:
providing a temporary counterpart sacrificial bond pad for all of the normal individual bond pads on the individual semiconductor devices.

11. The method for testing a semiconductor wafer according to claim 10,
wherein designated functional horizontal scribe lanes and designated functional vertical scribe lanes are configured to have a sufficient width to accommodate temporary counterpart sacrificial bond pads that are located back-to-back having a non-conductive separation therebetween.

12. The method for testing a semiconductor wafer according to claim 4,
wherein the temporary counterpart sacrificial bond pad is electrically connected to a corresponding normal individual bond pad located on an individual semiconductor device through the use of a re-distribution layer, which is a conductive layer provided over the semiconductor wafer surface and is otherwise electrically isolated from the individual semiconductor device.

13. The method for testing a semiconductor wafer according to claim 4, further comprising:
staggering a location on the temporary counterpart sacrificial bond pad of a plurality of physical contacts between the semiconductor wafer tester and the temporary counterpart sacrificial bond pad such that each physical contact is at a different location on the temporary counterpart sacrificial bond pad.

14. The method for testing a semiconductor wafer according to claim 4,
wherein the temporary counterpart sacrificial bond pads are smaller in size than the normal individual bond pads on the individual semiconductor devices, and the temporary counterpart sacrificial bond pads, located in a vertical and/or horizontal scribe lane between adjacent individual semiconductor devices, are arranged in a side-by-side configuration.

15. A semiconductor wafer configured with temporary counterpart sacrificial bond pads for testing individual semiconductor device on the semiconductor wafer, the semiconductor wafer comprising:

individual semiconductor devices arranged on the semiconductor wafer in a configuration having horizontal rows of the individual semiconductor devices with a functional horizontal scribe lane between each set of two horizontal rows of individual semiconductor devices, and having vertical columns of individual semiconductor devices with a functional vertical scribe lane between each set of two vertical columns of individual semiconductor devices, wherein the individual semiconductor devices include normal individual bond pads along a perimeter of each individual semiconductor device; and temporary counterpart sacrificial bond pads, located in one or more functional horizontal scribe lanes and/or one or more functional vertical scribe lanes, that are each electrically connected to a corresponding normal individual bond pad located on an individual semiconductor device, the temporary counterpart sacrificial bond pad being used for testing an individual semiconductor device located on the semiconductor wafer only before the individual semiconductor device is physically separated from the semiconductor wafer, wherein the temporary counterpart sacrificial bond pads are smaller in size than the normal individual bond pads located on the individual semiconductor devices, and wherein the temporary counterpart sacrificial bond pads for adjacent individual semiconductor devices are offset from one another, so that temporary counterpart sacrificial bond pads for adjacent individual bond pads are located side-by-side, and not located back-to-back, in a vertical scribe lane or a horizontal scribe lane.

16. The semiconductor wafer according to claim 15, wherein each temporary counterpart sacrificial bond pad is electrically connected to a corresponding normal individual bond pad located on an individual semiconductor device through the use of a re-distribution layer, which is a conductive layer provided over the semiconductor wafer surface and is otherwise electrically isolated from the individual semiconductor device.

17. The semiconductor wafer according to claim 15, wherein the temporary counterpart sacrificial bond pads are approximately 25% of the size of the normal individual bond pads located on an individual semiconductor device.

\* \* \* \* \*